(12) United States Patent
Schönholz (10) Patent No.: US 9,764,532 B2
(45) Date of Patent: Sep. 19, 2017

(54) PREPREGS INCLUDING UV CURABLE RESINS USEFUL FOR MANUFACTURING SEMI-FLEXIBLE PCBS

(71) Applicant: ISOLA USA CORP., Chandler, AZ (US)

(72) Inventor: Roland Schönholz, Schopfheim (DE)

(73) Assignee: Isola USA Corp., Chandler, AZ (US)

( * ) Notice: Subject to any disclaimer, the term of this patent is extended or adjusted under 35 U.S.C. 154(b) by 0 days.

(21) Appl. No.: 14/838,098

(22) Filed: Aug. 27, 2015

(65) Prior Publication Data

US 2016/0007442 A1 Jan. 7, 2016

Related U.S. Application Data

(63) Continuation of application No. PCT/US2015/038453, filed on Jun. 30, 2015.
(Continued)

(51) Int. Cl.
*B32B 15/08* (2006.01)
*B32B 27/04* (2006.01)
(Continued)

(52) U.S. Cl.
CPC ............ *B32B 15/08* (2013.01); *B32B 5/024* (2013.01); *B32B 5/26* (2013.01); *B32B 15/14* (2013.01); *B32B 15/20* (2013.01); *B32B 37/0076* (2013.01); *B32B 37/02* (2013.01); *B32B 37/26* (2013.01); *H05K 3/4691* (2013.01); *B32B 37/144* (2013.01); *B32B 37/30* (2013.01); *B32B 38/10* (2013.01); *B32B 2260/023* (2013.01); *B32B 2260/046* (2013.01); *B32B 2262/101* (2013.01); *B32B 2305/076* (2013.01); *B32B 2305/72* (2013.01); *B32B 2305/74* (2013.01); *B32B 2305/77* (2013.01); *B32B 2307/41* (2013.01); *B32B 2307/412* (2013.01); *B32B 2310/0831* (2013.01); *B32B 2457/08* (2013.01);
(Continued)

(58) Field of Classification Search
None
See application file for complete search history.

(56) References Cited

U.S. PATENT DOCUMENTS 4,056,421 A 11/1977 Jarvis
4,628,022 A * 12/1986 Ors .................. G03F 7/0035
430/280.1
(Continued)

FOREIGN PATENT DOCUMENTS

CN 102 555 652 7/2012
DE 4206746 C1 * 6/1993 ............ H05K 3/4691
(Continued)

OTHER PUBLICATIONS

English Abstract for JP 03064994 A, Mar. 1991.*
(Continued)

*Primary Examiner* — Jeff Vonch
(74) *Attorney, Agent, or Firm* — McDonnell Boehnen Hulbert & Berghoff LLP (57) ABSTRACT

Prepregs having a UV curable resin layer located adjacent to a thermally curable resin layer wherein the UV curable resin layer includes at least one UV cured resin portion and at least one UV uncured resin as well as methods for preparing flexible printed circuit boards using the prepregs.

8 Claims, 5 Drawing Sheets

Related U.S. Application Data (60) Provisional application No. 62/019,598, filed on Jul. 1, 2014.

(51) Int. Cl.

| | | |
|---|---|---|
| *H05K 1/02* | (2006.01) | |
| *H05K 1/11* | (2006.01) | |
| *H05K 3/46* | (2006.01) | |
| *B32B 5/02* | (2006.01) | |
| *B32B 5/26* | (2006.01) | |
| *B32B 15/14* | (2006.01) | |
| *B32B 15/20* | (2006.01) | |
| *B32B 37/00* | (2006.01) | |
| *B32B 37/02* | (2006.01) | |
| *B32B 37/26* | (2006.01) | |
| *B32B 37/06* | (2006.01) | |
| *B32B 38/10* | (2006.01) | |
| *B32B 37/14* | (2006.01) | |
| *H05K 1/14* | (2006.01) | |
| *B32B 37/30* | (2006.01) | |
| *H05K 3/42* | (2006.01) | |

(52) U.S. Cl.
CPC ........... *H05K 1/028* (2013.01); *H05K 1/0278* (2013.01); *H05K 1/118* (2013.01); *H05K 1/147* (2013.01); *H05K 3/429* (2013.01); *H05K 2201/0195* (2013.01); *H05K 2201/095* (2013.01); *H05K 2201/09063* (2013.01); *H05K 2201/09081* (2013.01); *Y10T 428/2486* (2015.01); *Y10T 428/24314* (2015.01); *Y10T 428/24322* (2015.01); *Y10T 428/24331* (2015.01); *Y10T 428/24612* (2015.01); *Y10T 428/24802* (2015.01); *Y10T 428/24851* (2015.01)

(56) References Cited

U.S. PATENT DOCUMENTS

| | | | | |
|---|---|---|---|---|
| 4,751,146 | A | 6/1988 | Maeda et al. | |
| 5,142,448 | A * | 8/1992 | Kober | H05K 3/4691 174/254 |
| 5,144,534 | A * | 9/1992 | Kober | H05K 3/4691 174/254 |
| 5,144,742 | A * | 9/1992 | Lucas | H05K 3/4691 156/291 |
| 5,175,047 | A * | 12/1992 | McKenney | H05K 3/4691 174/250 |
| 5,263,248 | A * | 11/1993 | Kiyota | H05K 3/4691 174/254 |
| 6,558,975 | B2 * | 5/2003 | Sugino | H01L 21/6836 257/E21.505 |
| 6,896,760 | B1 * | 5/2005 | Connell | H01L 21/6835 156/249 |
| 7,508,081 | B2 * | 3/2009 | Matsumura | C09J 7/02 257/782 |
| 8,093,502 | B2 * | 1/2012 | Mikado | H05K 1/0281 174/254 |
| 2001/0010303 | A1 * | 8/2001 | Caron | H05K 3/4691 216/18 |
| 2004/0135293 | A1 | 7/2004 | Umeki | |
| 2008/0099134 | A1 * | 5/2008 | Tadakuma | B32B 37/0076 156/250 |
| 2010/0051325 | A1 * | 3/2010 | Sato | H05K 3/4691 174/254 |
| 2010/0059262 | A1 * | 3/2010 | Weidinger | H05K 1/00 174/258 |
| 2011/0014419 | A1 * | 1/2011 | Simmons | B29C 70/20 428/114 |
| 2011/0018127 | A1 * | 1/2011 | Lee | C09J 7/00 257/729 |
| 2011/0272177 | A1 * | 11/2011 | Weichslberger | H05K 3/4691 174/250 |
| 2012/0228005 | A1 * | 9/2012 | Chisaka | H05K 3/4691 174/250 |
| 2013/0220535 | A1 * | 8/2013 | Lee | H05K 3/4644 156/268 |
| 2015/0334825 | A1 * | 11/2015 | Bahl | C23C 18/38 174/251 |
| 2016/0007482 | A1 * | 1/2016 | Schonholz | B32B 5/26 156/275.5 |

FOREIGN PATENT DOCUMENTS

| | | | | | |
|---|---|---|---|---|---|
| EP | | 2467003 | A2 * | 6/2012 | ........... H05K 3/4691 |
| JP | | 03062591 | A * | 3/1991 | |
| JP | | 03064994 | A * | 3/1991 | |
| JP | | 03141693 | A * | 6/1991 | |
| JP | | 03141694 | A * | 6/1991 | |
| JP | | 05327209 | A * | 12/1993 | |
| JP | | 06204663 | A * | 7/1994 | |
| JP | | 06338663 | A * | 12/1994 | |
| JP | | 07212035 | A * | 8/1995 | |
| JP | | 10022645 | A * | 1/1998 | |
| JP | | 2001127410 | A * | 5/2001 | |
| JP | | 2004087701 | A * | 3/2004 | |
| JP | | 2005123468 | A * | 5/2005 | |
| JP | | 2006080212 | A * | 3/2006 | |
| JP | | 2006093647 | A * | 4/2006 | |
| JP | | 2006173188 | A * | 6/2006 | |
| JP | | 2008034433 | A * | 2/2008 | |
| JP | | 2009290193 | A * | 12/2009 | |
| WO | WO | 9311652 | A1 * | 6/1993 | ........... H05K 3/4691 |
| WO | WO | 2009/041510 | | 4/2009 | |
| WO | WO | 2009069683 | A1 * | 6/2009 | ............. H05K 1/183 |

OTHER PUBLICATIONS

English Abstract for JP 03141694 A, Jun. 1991.*
Machine Translation of JP 2006093647 A, Apr. 2006.*
Machine Translation of EP 2467003 A2, Jun. 2012.*
English Translation for JP 03141694 A, Jun. 1991.*

* cited by examiner

PREPREGS INCLUDING UV CURABLE RESINS USEFUL FOR MANUFACTURING SEMI-FLEXIBLE PCBS

This is a continuation of PCT/US2015/38453 filed on Jun. 30, 2015, which claims priority to U.S. provisional application No. 62/019,598, filed on Jul. 1, 2014, the specifications of each of which are incorporated herein by reference.

BACKGROUND OF THE INVENTION (1) Field of the Invention

This invention concerns films and prepregs including UV curable resins that are useful in the manufacture of flexible PCBs as well as to methods for using the films and prepregs in the manufacture of printed circuit boards.

(2) Description of the Art

Currently, standard flex-rigid multilayer manufacturing processes use flexible polyimide sheets to overlay the copper structures and noflow prepregs. Such standard flex-rigid laminates use expensive materials. Moreover, the manufacturing method is very complex and requires multiple manual processing steps.

Figure 1:
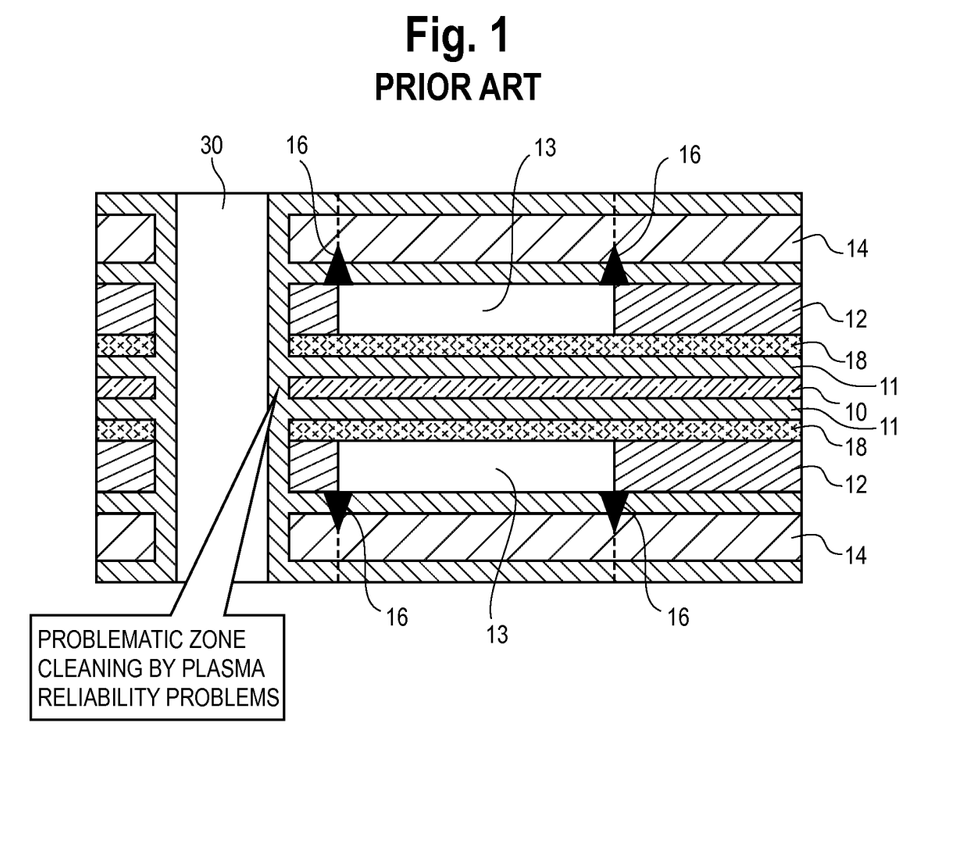
FIG. 1 is a flexible layup made by a prior art method.

A prior art method for constructing build-ups for an inner-layer flexible multilayer is shown in FIG. 1. The build-ups are formed stepwise by:

structuring a polyamide foil layer including a polyamide planar core (10) a copper layers (11) on each planar polyamide sheet surface and coverlayers (18) overlying the copper layers (11);
milling a c-staged prepreg layer (12) to form a space (13);
applying a cover layer (14);
laminating the partial layup;
depth milling at the core top and bottoms (shown by black triangles (16));
stacking-up and lamination of the multilayer; and
removing the rigid portion of the cores overlying space (13) by milling.

The prior art laminate includes a plated through hole (PTH) (30). The area of the plated through hole in the vicinity of the structured polyamide foil layer creates reliability problems because it requires plasma cleaning. In addition, issues with inadequate metallization of the PTH are common and undesirable barrel cracks can form due to the high thermal expansion of the polyimide and the cover layer in comparison the PTH thermal expansion. Moreover, during the lamination process, little to no pressure is applied to cover layer (14) and polyimide foil layer (10). As a result, PTFE inlays are placed in the stack by hand to increase the stack laminating pressure.

Figure 2:
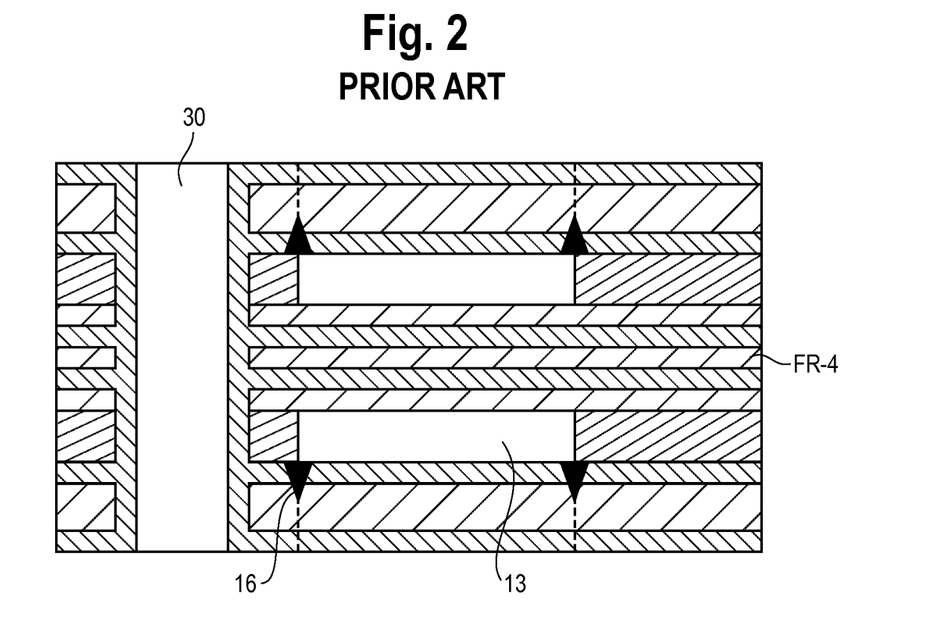
FIG. 2 represents an alternative to the flexible layup of FIG. 1 in which the polyamide foil layer is replaced with an FR4 material layer.

Instead of using the polyamide foil layer (10), a cheaper FR4 material layer can be used instead such as is shown in FIG. 2. However the disadvantage of using the FR4 material is that the resulting layup can only be bent a few times before it becomes damaged. There is a need, therefore, for improved methods for manufacturing flexible multilayer inner-layer laminates that are used to manufacture printed circuit boards that do not suffer from one or more of the problems mentioned above.

SUMMARY OF THE INVENTION

One or more of the shortcomings with flexible laminates made with polyimide foil layers that are noted above can be overcome by replacing the polyimide foil layer with a prepreg comprising a partially (b-staged) or fully (c-staged) cured thermally curable resin layer and an adjacent UV curable resin layer wherein the UV curable resin layer has at least one UV light cured resin portion and at least on UV light uncured resin portion.

Another aspect of this invention is a laminate comprising a flexible core having a first planar surface and a second planar surface the flexible core including an optional copper foil layer on one or both of the first and second planar surfaces, a UV curable resin layer having at first planar surface associated with one of the planar surfaces of the flexible core wherein the UV curable resin layer has at least one UV light cured resin portion and at least on UV light uncured resin portion and a thermally cured resin layer adhered to a second planar surface of the UV curable resin layer.

Yet another aspect of this invention are methods for manufacturing a flexible inner-layer that include the steps of:

(a) applying a mask to a first prepreg including a UV curable resin layer and a thermally curable resin layer wherein the mask is applied to the UV curable resin layer, the mask including at least one UV light transparent portion and at least one UV light opaque portion;
(b) directing UV light at the mask for a period of time sufficient to cure the UV curable resin layer underlying the UV light transparent portion of the mask to form a UV light treated first prepreg having at least one cured UV resin portion and at least one uncured UV resin portion;
(c) contacting a core layer with the UV light treated first prepreg such that the at least one cured UV resin portion and the at least one uncured UV resin portion contact the core layer to form a layup; and
(d) applying heat and/or pressure to the lay-up to form a laminated layup including a rest material portion of the semi-flexible core layer that overlies the at least one cured UV resin portion where the semi-flexible core layer is not substantially laminated to the at least one cured UV resin portion. By "not substantially laminated" we mean the peel strength of any bond between the at least one cured UV resin portion and the semi-flexible core layer is at least 50% and preferably at least 90% less than the peel strength of any bond between the at least one uncured UV resin portion and the semi-flexible core layer for the same laminated layup.

DESCRIPTION OF THE FIGURES

FIG. 5 is a partially UV cured prepreg resulting from the UV curing step represented by FIG. 4.

DESCRIPTION OF CURRENT EMBODIMENTS

The present invention relates to the use of special prepregs to replace the flexible polyimide sheets currently used in some flexible printed circuit board manufacturing processes. Laminates and printed circuit boards made with the prepregs of this invention suffer from fewer reliability problems such as barrel cracks in PTH's. In addition, no special plasma cleaning/desmearing steps are necessary.

Figure 3:
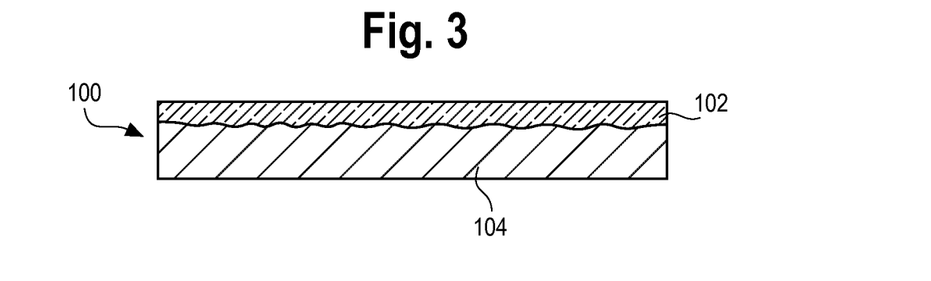
FIG. 3 is a side view of a prepreg (100) of this invention including a UV curable resin layer (102) located adjacent to a thermally curable resin layer (104) that is partially cured.

Referring now to the Figures, there is shown in FIG. 3 a prepreg (100) including a UV curable resin layer (102) located adjacent to a thermally curable resin layer (104) that is at least partially cured (b-staged) and that may, in some applications, be fully cured or c-staged. UV curable resin layer (102) may be of any useful thickness, i.e., thick enough to cause a sufficient amount of melted resin to adhere adjacent layers of a layup. The UV curable resin layer will typically have a thickness ranging from about 2 µm to about 50 µm and more preferably from about 5 µm to about 20 µm. Moreover, the UV curable resin can be applied to an exposed planar surface of thermally curable resin layer (104) by spraying, by applying it with rollers, or by any other known methods.

Any UV curable resin (or photopolymer) that is capable of becoming at least partially liquid and flowable under normal printed circuit board laminating conditions may be used. Examples of useful UV curable resins include, but are not limited to Ultraviolet (UV) and electron beam (EB) energy-cured materials such as urethanes acrylates, polyester acrylates, amino acrylates and epoxy acrylates. In addition, the UV curable materials may include photoinitiators and additives that enhance the performance of the pre and post cured materials.

The properties of a photocured material, such as flexibility, adhesion, and chemical resistance can be provided by functionalized oligomers present in the photocurable composite. As noted above, oligomer photopolymers are typically epoxies, urethanes, polyethers, or polyesters, each of which provides specific properties to the resulting material. Each of these oligomers is typically functionalized by an acrylate. An example shown below is an epoxy oligomer that has been functionalized by acrylic acid. Acrylated epoxies are useful as coatings on metallic substrates, and result in glossy hard coatings.

Acrylated urethane oligomers are typically abrasion resistant, tough, and flexible making ideal coatings for floors, paper, printing plates, and packaging materials. Acrylated polyethers and polyesters result in very hard solvent resistant films, however, polyethers are prone to UV degradation and therefore are rarely used in UV curable material. Often formulations are composed of several types of oligomers to achieve the desirable properties for the material.

As noted above, the prepreg (100) will include a thermally curable resin layer (104). This layer will typically have a thickness of from about 5 µm to about 100 µm and more preferably about 30-60 µm.

The thermally curable resin layers may be made from resins, resin systems or mixtures of resins that are commonly used in the manufacture of printed circuit boards. The resin(s) will typically be a thermoset or thermoplastic resin. Non-limiting examples of useful resins include epoxy resins, cyanurate resins, bismaleimide resins, polyimide resins, phenolic resins, furan resins, xylene formaldehyde resins, ketone formaldehyde resins, urea resins, melamine resins, aniline resins, alkyd resins, unsaturated polyester resins, diallyl phthalate resins, triallyl cyanurate resins, triazine resins, polyurethane resins, silicone resins and any combination or mixture thereof.

In one aspect of this invention, the resin is or includes an epoxy resin. Some examples of useful epoxy resins include phenol type epoxy resins such as those based on the diglycidyl ether of bisphenol A, on polyglycidyl ethers of phenol-formaldehyde novolac or cresol-formaldehyde novolac, on the triglycidyl ether of tris(p-hydroxyphenol)methane, or on the tetraglycidyl ether of tetraphenylethane; amine types such as those based on tetraglycidyl-methylenedianiline or on the triglycidyl ether of p-aminoglycol; cycloaliphatic types such as those based on 3,4-epoxycyclohexylmethyl-3,4-epoxycyclohexane carboxylate. The term "epoxy resin" also stands for reaction products of compounds containing an excess of epoxy (for instance, of the aforementioned types) and aromatic dihydroxy compounds. These compounds may be halogen-substituted. One class of useful epoxy-resins are those that are derivatives of bisphenol A, particularly FR-4. FR-4 is made by an advancing reaction of an excess of bisphenol A diglycidyl ether with tetrabromobisphenol A. Mixtures of epoxy resins with bismaleimide resin, cyanate resin and/or bismaleimide triazine resin can also be applied.

The resin compositions, in addition to a base resin will typically include initiators or catalysts, one or more optional flame retardants and solvents. The flame retardant may be any flame retardant material that is known to be useful in resin compositions used to manufacture prepregs and laminates use to manufacture printed circuit boards. The flame retardant(s) may contain halogens or they may be halogen free. Alternatively, or in addition, the resins may include halogens such as bromine in their backbone structure to impart the cured resin with flame retardant properties.

The resin compositions may also include polymerization initiators or catalysts. Examples of some useful initiators or catalysts include, but are not limited to peroxide or azo-type polymerization initiators (catalysts). In general, the initiators/catalysts chosen may be any compound that is known to be useful in resin synthesis or curing whether or not it performs one of these functions.

The resin compositions will include one or more solvents which are typically used to solubilize the appropriate resin composition ingredients and/or to control resin viscosity and/or in order to maintain the resin ingredients in a suspended dispersion. Any solvent known by one of skill in the art to be useful in conjunction with thermosetting resin systems can be used. Particularly useful solvents include methylethylketone (MEK), toluene, dimethylformamide (DMF), or mixtures thereof. As noted below, the resin compositions are used to manufacture prepregs and laminates. During the manufacturing process, the reinforcing materials are impregnated with or otherwise associated with the resin compositions and some or most of the solvent is removed from the resin compositions to form the prepregs and laminates. Thus, when resin composition or laminate weight percent amounts are listed herein, they are reported on a dry-solvent free-basis unless otherwise noted.

The resin compositions may include a variety of other optional ingredients including fillers, tougheners, adhesion promoters, defoaming agents, leveling agents, dyes, and pigments. For example, a fluorescent dye can be added to the resin composition in a trace amount to cause a laminate prepared therefrom to fluoresce when exposed to UV light in a board shop's optical inspection equipment. Other optional ingredients known by persons of skill in the art to be useful in resins that are used to manufacture printed circuit board laminates may also be included in the resin compositions of this invention.

Figure 4:
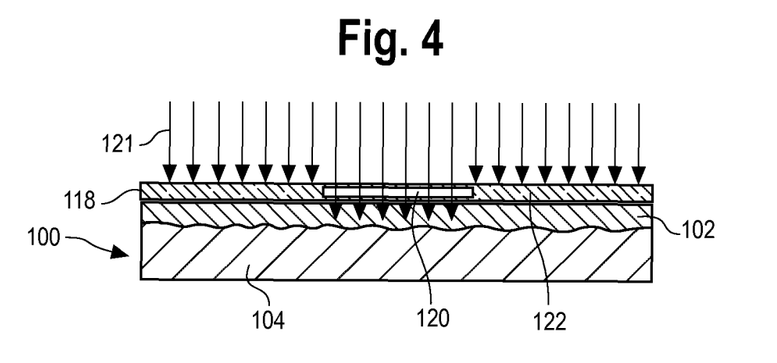
FIG. 4 is cross section of the prepreg of FIG. 3 and further includes a mask layer (108) having a UV light transparent portion (120) and a UV light opaque portion (122)
Figure 5:
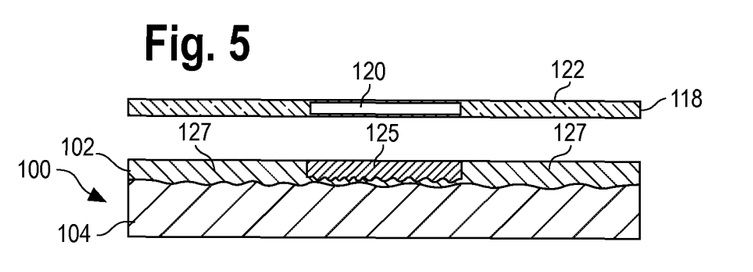
In FIG. 5, the prepreg includes a UV curable resin layer that has at least one UV polymerized (cured) portion (125) that underlies the UV light transparent portion (120) of mask layer (118) and at least one uncured UV resin portion(s) (127) that underlies the opaque portion(s) mask layer (122)

FIGS. 4 and 5 are side view of prepreg (100) of this invention during and after a UV light curing process. FIG. 4 is a side view of the prepreg of FIG. 3 including a mask layer (118) having a UV light transparent portion (120) and a UV light opaque portion (122). In FIG. 4, UV light (121) having a wavelength that is selected to cure the UV curable resin is directed at prepreg (100). The UV light passes through transparent portion (120) of mask (118) and cures the UV curable resin that underlies transparent portion (120). UV light is not able to pass through opaque portion (122) of mask (118) with the result that UV curable resin that lies below mask opaque portion (22) remains uncured and flowable for subsequent lamination steps. The mask layer may be any material that is opaque to UV light of the wavelength necessary to cure the UV curable resin. The transparent portions of mask (118) can be prepared by cutting out our removing portions of the opaque mask material to form windows through which UV light can pass. Other methods know in the art for creating a mask having UV opaque portions and UV transparent portions may be used to make mask (118).

The partially UV cured prepreg resulting from the UV light exposure step is shown in FIG. 5. The partially UV cured prepreg includes UV curable resin layer (102) that has at least one UV polymerized (cured) portion (125) that underlies the UV light transparent portion (120) of mask layer (118) and at least one uncured UV resin portion(s) (127) that underlies the opaque portion(s) (122) of mask layer (118). The resin of the at least one UV cured portion (125) is essentially fully cured or c-staged and will not flow or be tacky in subsequent lamination steps.

Figure 6:
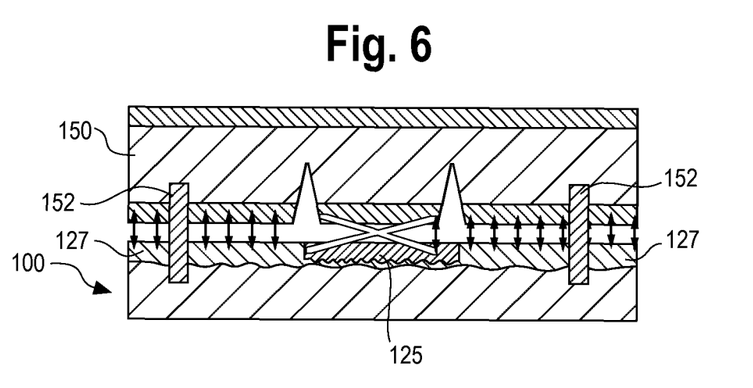
FIG. 6 is side view of a layup undergoing pin lamination where the layup includes the partially UV cured laminate of FIG. 5.

FIG. 6 is a side view of the partially UV cured prepreg of FIG. 5 during pin lamination of the prepreg to a semi-flexible core (150) including a first copper layer (154) and a second copper layer (156). In the pin lamination step, optional pins (152) are used to keep prepreg (100) in registration with at least one semi-flexible core (150). In FIG. 6, core (150) is fully cured. During the pin lamination process, the thermally hardening epoxy and not the UV exposed resin works as an adhesive in the stack (black arrows) and adheres the layers together only in the areas of the at least one uncured UV resin portions (127) to form a laminated layup. The at least one UV cured portion (125) of prepreg (100) is cured or hardened prior to lamination and, as a result, there is no adhesion between prepreg (100) and layer (150) in this region because the thermally curable resin cannot flow in this region during lamination. In this way, the uncured portion of the prepreg can be removed from the laminate without first having to create a space (13) in the central portion of the layup as required in the prior art FIG. 1.

Figure 7:
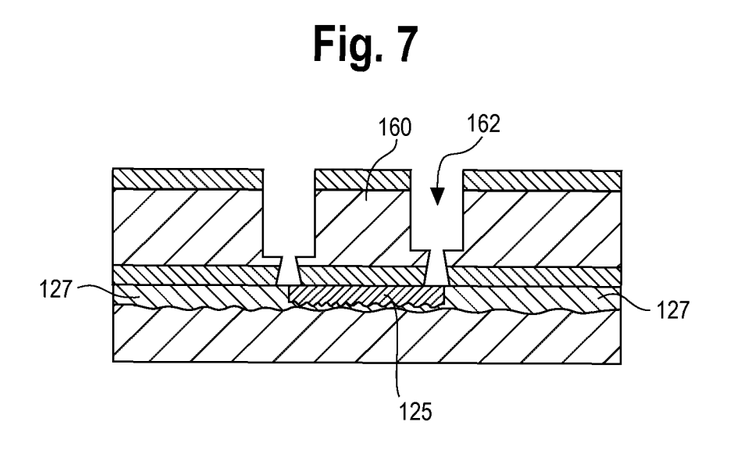
FIG. 7 and FIG. 8 are side views of the layup during and following milling and rest removal steps.
Figure 8:
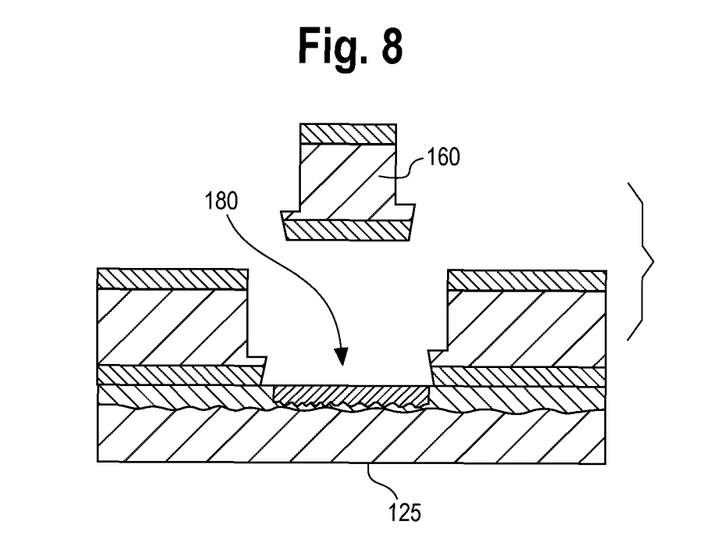

FIGS. 7 and 8 are side views of the laminated layup of FIG. 6 wherein a rest material portion (160) of the core material is removed by milling. In FIG. 7, the rest material portion (160) is formed by milling the perimeter (162) of the rest material portion (160) down to the at least one cured UV resin layer portion (125). The milling creates a perimeter around rest material portion (160) that lies above or substantially above the at least one UV cured resin layer portion (125). Since rest material potion (160) is not adhered to the underlying at least one cured UV resin portion (125), separation of rest material portion (160) from the laminated layup is simplified and can be accomplished without further milling to form a semi-flexible area (180) of the laminate as shown in FIG. 8.

Figure 9:
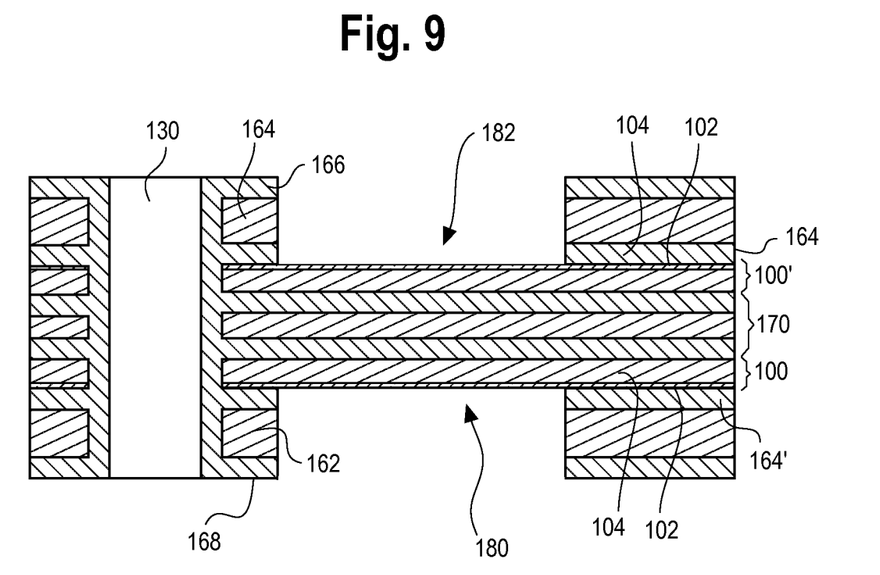
FIG. 9 is a side view of a bendable printed circuit board layup of this invention.

FIG. 9 is a side view of a multilayer layup including two semi-flexible cores (170) flanked on both surfaces by prepregs (100, 100') wherein the thermally curable resin layer (104) of prepreg (100) abuts the surface of semi-flexible core (170) and wherein the a UV curable resin layer (102) is outwardly facing. The layup further includes a second core layer (162) and third core layer (164) each associated with one of the UV curable resin layer surfaces of prepregs (100, 100') and separated from the UV curable resin layer (102) by an optional layer of copper (164, 164'). Moreover, each core (162) and (164) include an optional outwardly facing copper surface (166, 168). The multilayer layup further includes two opposing cavities (180, 182) formed as described above by removing rest material from the layup as well as a plated through hole (130). As can be seen from FIG. 9, more than one semi-flexible core layer can be used during the manufacture of printed circuit boards having multiple laminate layers.

Prepregs and Laminates

The thermosetting resins and UV curable resins described above are useful for preparing prepregs shown in side-view in FIG. 3. In order to be useful in manufacturing printed circuit boards the resins can be formulated and partially cured—or b-staged—to form prepreg sheets. As prepregs, the sheets can be laid up with additional material sheets to form a "stack" which can be further cured and or laminated to form a fully cured laminate sheet. The resulting laminate sheet can be a final product or it can be used as a layer in further printed circuit board manufacturing steps. In one useful processing system, prepregs (100) can be manufactured in a batch or in a continuous process. For example, sheets of partially cured thermal resins can be prepared and then a UV curable resin can be located on one surface of the partially cured thermal resin sheet to form prepreg (100). Prepregs (100) are optionally manufactured using a core material such a thermally curable resin impregnated woven glass fabric. However, if a core material is used it either can only be associated with a prepreg layer that is opposite the surface of the prepreg though which the UV light must pass to reach the UV curable resin or it must be sufficiently transparent to UV light to allow the UV light to pass through the core material and reach the underlying UV curable resin layer. The core material—e.g. woven glass fabric—can be supplied in a rolled up sheet of woven glass web (fabric) which is unwound into a series of drive rolls. The web then passes into a coating area where the web is passed through a tank which contains the thermosetting resin system of this invention, solvent and other components where the glass web becomes saturated with the resin. The saturated glass web is then passed through a pair of metering rolls which remove excess resin from the saturated glass web and thereafter, the resin coated web travels the length of a drying tower for a selected period of time until the solvent is evaporated from the web. A second and subsequent coating of resin can be applied to the web by repeating these steps until the preparation of the prepreg is complete whereupon the prepreg is wound onto roll. The woven glass web can be replaced with a woven fabric material, paper, plastic sheets, felt, and/or particulate materials such as glass fiber particles or particulate materials.

In another process for manufacturing prepregs, thermosetting resins are premixed in a mixing vessel under ambient temperature and pressure. The viscosity of the pre-mix can be adjusted by adding or removing solvent from the resin. The thermosetting resin (varnish) mix can be used to manufacture unreinforced prepreg sheets and it can also be applied in a thin layer to a Cu foil substrate (RCC—resin coated Cu) using slot-die or other related coating techniques. Thus, it is possible that prepregs used in this invention can include one partially cured thermally curable resin layer having a copper foil on one surface of the sheet. If necessary some or all of the copper foil sheet can be removed to expose the underlying UV curable resin to a UV light source. Indeed, the copper layer can be used as the mask layer and portions of the copper layer can be removed to form UV light transparent portions of the prepreg.

The term "UV curable resin" is used herein to refer to a type of resin—a resin that becomes cured upon exposure to UV light. The term is not intended to indicate the degree of cure of the resin—cured vs. uncured.

The foregoing description of the specific embodiments will reveal the general nature of the disclosure so others can, by applying current knowledge, readily modify and/or adapt for various applications such specific embodiments without departing from the generic concept, and therefore such adaptations and modifications are intended to be comprehended within the meaning and range of equivalents of the disclosed embodiments. It is to be understood that the phraseology or terminology herein is for the purpose of description and not of limitation.

What is claimed is:

1. A laminated layup comprising:
    a prepreg comprising a first thermally curable resin layer and an adjacent UV curable resin layer wherein the thermally curable resin layer has a thickness of about 5 μm to about 100 μm and the UV curable resin layer has a thickness of about 5 μm to about 20 μm wherein the thermally curable resin layer is b-staged or c-staged and wherein the UV curable resin layer has at least one UV light cured resin portion and at least one UV light uncured resin portion; and
    a semi-flexible core layer wherein the semi-flexible core layer is at least partially adhered to the prepreg UV curable resin layer and wherein a rest material portion of the semi-flexible core layer overlies the at least one cured UV resin portion where the semi-flexible core layer is not substantially laminated to the at least one cured UV resin portion.

2. The laminated layup of claim 1, wherein the thermally curable resin layer is c-staged.

3. The laminated layup of claim 1 wherein the rest material is removed from the laminated layup to form a cavity.

4. The laminated layup of claim 1 further comprising:
    a second semi-flexible core layer having a first planar surface and a second planar surface wherein the thermally curable resin layer of the prepreg is adhered to the first planar surface of the second semi-flexible core layer; and
    a second prepreg comprising a UV curable resin layer and a thermally curable resin layer wherein the thermally curable resin layer is adhered to the second planar surface of the second semi-flexible core layer.

5. The laminated layup of claim 4 wherein a layer of copper comprises the first surface of second semi-flexible core layer.

6. The laminated layup of claim 4 wherein a layer of copper comprises the second surface of second semi-flexible core layer.

7. The laminated layup of claim 4 wherein the laminated layup includes a plated through hole.

8. A circuit board including at least one laminated layup of claim 3.

* * * * *